United States Patent
Lee et al.

(10) Patent No.: US 9,420,683 B2
(45) Date of Patent: Aug. 16, 2016

(54) SUBSTRATE EMBEDDING PASSIVE ELEMENT

(71) Applicant: Samsung Electro-Mechanics Co., Ltd., Suwon (KR)

(72) Inventors: Doo Hwan Lee, Daejeon (KR); Yul Kyo Chung, Yongin (KR); Yee Na Shin, Suwon (KR); Seung Eun Lee, Sungnam (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 102 days.

(21) Appl. No.: 14/143,727

(22) Filed: Dec. 30, 2013

(65) Prior Publication Data

US 2014/0185258 A1    Jul. 3, 2014

(30) Foreign Application Priority Data

Dec. 31, 2012 (KR) .......................... 10-2012-0158335

(51) Int. Cl.
*H05K 1/18* (2006.01)
*H05K 1/02* (2006.01)
(Continued)

(52) U.S. Cl.
CPC ........ *H05K 1/0231* (2013.01); *H01L 23/49822* (2013.01); *H01L 23/49827* (2013.01); *H01L 23/642* (2013.01); *H05K 1/185* (2013.01); *H01L 2224/16225* (2013.01); *H05K 1/115* (2013.01); *H05K 1/182* (2013.01); *H05K 3/4602* (2013.01);
(Continued)

(58) Field of Classification Search
CPC ....... H05K 1/44; H05K 3/284; H05K 3/3447; H05K 1/141; H05K 3/3452; H05K 1/189; H05K 1/118; H05K 2201/2009; H05K 3/0058; H05K 1/147; H05K 3/281; H01L 2224/48091; H01L 2924/01078; C01B 21/068; H01F 21/02
USPC ................ 361/736, 746, 748–751, 760–764; 174/250–266
See application file for complete search history.

(56) References Cited

U.S. PATENT DOCUMENTS 7,350,296 B2 *   4/2008   Ryu et al. ......................... 29/852
8,829,356 B2 *   9/2014   Hsu ................... H01L 23/49822
                                                                174/257

(Continued)

FOREIGN PATENT DOCUMENTS

JP   2001-345559   12/2001
JP   2007-258542   10/2007

(Continued)

OTHER PUBLICATIONS

Korean Notice of Allowance dated Sep. 23, 2014 in corresponding Korean Patent Application No. 10-2012-0158335.

(Continued)

*Primary Examiner* — Hoa C Nguyen
*Assistant Examiner* — Roseline Alicia Rivera
(74) *Attorney, Agent, or Firm* — NSIP Law

(57) ABSTRACT

A substrate embedding a passive element includes a first conductor pattern layer disposed on a lower surface thereof and a second conductor pattern layer disposed on an upper surface thereof; a first via electrically connecting between the passive element and the first conductor pattern layer; and a second via electrically connecting between the passive element and the second conductor pattern layer, in which a volume of the first via is larger than that of the second via.

8 Claims, 3 Drawing Sheets

(51) Int. Cl.
*H01L 23/498* (2006.01)
*H01L 23/64* (2006.01)
*H05K 1/11* (2006.01)
*H05K 3/46* (2006.01)

(52) U.S. Cl.
CPC ............ *H05K 2201/09827* (2013.01); *H05K 2201/09854* (2013.01)

(56) References Cited

U.S. PATENT DOCUMENTS

| | | | | |
|---|---|---|---|---|
| 2002/0071256 | A1* | 6/2002 | Figueroa | H01L 23/50 361/763 |
| 2006/0012966 | A1* | 1/2006 | Chakravorty | H01L 23/50 361/763 |
| 2006/0191711 | A1* | 8/2006 | Cho | H01L 23/5389 174/260 |
| 2006/0207790 | A1* | 9/2006 | Choi | H01L 24/05 174/262 |
| 2010/0032195 | A1* | 2/2010 | Hayashi | H01L 23/49827 174/260 |
| 2011/0215478 | A1* | 9/2011 | Yamamichi | H01L 23/522 257/773 |
| 2013/0081866 | A1* | 4/2013 | Furutani | H05K 1/185 174/260 |

FOREIGN PATENT DOCUMENTS

| | | |
|---|---|---|
| JP | 2007-258544 | 10/2007 |
| KR | 10-2007-0101183 | 10/2007 |
| KR | 10-2012-0034386 | 4/2012 |

OTHER PUBLICATIONS

Korean Office Action issued Dec. 24, 2013 in corresponding Korean Patent Application No. 10-2012-0158335.

Taiwanese Office Action issued on Jul. 24, 2015 in counterpart Taiwanese Application No. 102144750. (7 pages with partial English translation).

* cited by examiner

SUBSTRATE EMBEDDING PASSIVE ELEMENT

CROSS-REFERENCE TO RELATED APPLICATIONS

This application claims the foreign priority benefit under 35 U.S.C. Section 119 of Korean Patent Application Serial No. 10-2012-0158335 entitled "Substrate Embedding Passive Element" filed on Dec. 31, 2012, which is hereby incorporated by reference in its entirety into this application.

BACKGROUND

1. Field

Embodiments of the present invention relate to a substrate embedding a passive element.

2. Description of the Related Art

As mobile devices, such as a smart phone and a tablet PC, which are recently being released, require remarkably improved performance and portability, research into miniaturization, slimness, high performance of electronic parts used in the mobile devices has been continuously conducted.

Herein, a substrate embedding an electronic part disclosed in related art document Korean Patent-Laid Open Publication No. 2007-0101183, and the like may secure a space to mount extra parts on a surface of the substrate, and therefore has been in the limelight as a method for implementing miniaturization, slimness, and high performance of electronic parts mounted in the mobile device.

In particular, as performance of a semiconductor chip is improved, stability of power supplied to the semiconductor chip has been gradually important. To this end, a so-called decoupling capacitor or bypass capacitor is disposed between the semiconductor chip and a power supply line to remove noise from power and stably supply a current to the semiconductor chip even in the situation in which a power supply current is suddenly changed.

In this case, when the semiconductor chip is mounted on a substrate embedding a capacitor, a distance between the decoupling capacitor and the semiconductor chip may be minimized, thereby stably supplying power to the high-performance semiconductor chip and implementing miniaturization and slimness.

Meanwhile, the above-cited document discloses a method of machining a cavity at a position at which electronic parts are placed, fixing a capacitor therein, embedding it by performing thermo compression using an insulating material, machining a micro via hole with a laser, and performing electrical connection by plating has been disclosed.

That is, in order to electrically connect between the electronic part embedded in the substrate and a circuit pattern formed on the surface of the substrate, a method of machining a via hole with a laser and filling an inside of the via hole with a conductive material by a plating method, and the like has been generally used.

Meanwhile, when a passive element such as a capacitor which is used to stabilize a power supply voltage supplied to an active element such as a semiconductor chip is embedded, there is a need to maximally reduce impedance of a path between the passive element and the active element and secure connection reliability therebetween.

However, due to a limitation of a manufacturing technology and a process, the related art has a limitation in reducing the impedance of the current path between the passive element embedded in the substrate and other devices.

SUMMARY

An aspect of the present invention is to provide a substrate embedding a passive element capable of reducing impedance in a current path between the passive element and other devices.

According to an exemplary embodiment of the present invention, there is provided a substrate embedding a passive element, including: an insulating layer in which a passive element having an external electrode is embedded; a first conductor pattern layer disposed on a lower surface of the insulating layer; a second conductor pattern layer disposed on an upper surface of the insulating layer; an active element mounted on the second conductor pattern layer; a first via electrically connecting between a lower surface of the external electrode and the first conductor pattern layer; and a second via electrically connecting between an upper surface of the external electrode and the second conductor pattern layer and having a volume smaller than that of the first via.

According to another exemplary embodiment of the present invention, there is provided a substrate embedding a passive element including a first conductor pattern layer disposed on a lower surface thereof and a second conductor pattern layer disposed on an upper surface thereof and including an external electrode, the substrate embedding a passive element including: a first via electrically connecting between a lower surface of the external electrode and the first conductor pattern layer; and a second via electrically connecting between an upper surface of the external electrode and the second conductor pattern layer, in which a volume of the first via is larger than that of the second via.

A height of the first via may be 0.5 to 1.5 times as large as that of the second via.

A cross sectional area of a surface on which the one first via contacts the lower surface of the external electrode may be larger than that of a surface on which the one second via contacts the upper surface of the external electrode.

A cross sectional area of a surface on which the one first via contacts the second conductor pattern layer may be larger than that of a surface on which the one second via contacts the first conductor pattern layer.

The number of first vias may be larger than the number of second vias.

The number of first vias may be at least two.

According to still another exemplary embodiment of the present invention, there is provided a substrate embedding a passive element including a first conductor pattern layer disposed on a lower surface thereof and a second conductor pattern layer directly contacting an external terminal of an active element and including an external electrode, the substrate embedding a passive element including: a first via electrically connecting between a lower surface of the external electrode and the first conductor pattern layer; and a second via electrically connecting between an upper surface of the external electrode and the second conductor pattern layer, in which a volume of the first via is larger than that of the second via.

The passive element may be a multi-layered ceramic capacitor (MLCC).

A height of the first via may be 0.5 to 1.5 times as large as that of the second via.

A cross sectional area of a surface on which the one first via contacts the lower surface of the external electrode may be larger than that of a surface on which the one second via contacts the lower surface of the external electrode.

A cross sectional area of a surface on which the one first via contacts the second conductor pattern layer may be larger than that of a surface on which the one second via contacts the first conductor pattern layer.

The number of first vias may be at least two.

According to still another exemplary embodiment of the present invention, there is provided a substrate embedding a passive element, including: an insulating layer in which a passive element is embedded; a first conductor pattern layer disposed on a lower surface of the insulating layer; a second conductor pattern layer disposed on an upper surface of the insulating layer; an active element mounted on the second conductor pattern layer; a first via electrically connecting between the passive element and the first conductor pattern layer; and a second via electrically connecting between the passive element and the second conductor pattern layer having a volume smaller than that of the first via.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which.

DESCRIPTION OF EMBODIMENTS

Figure 1:
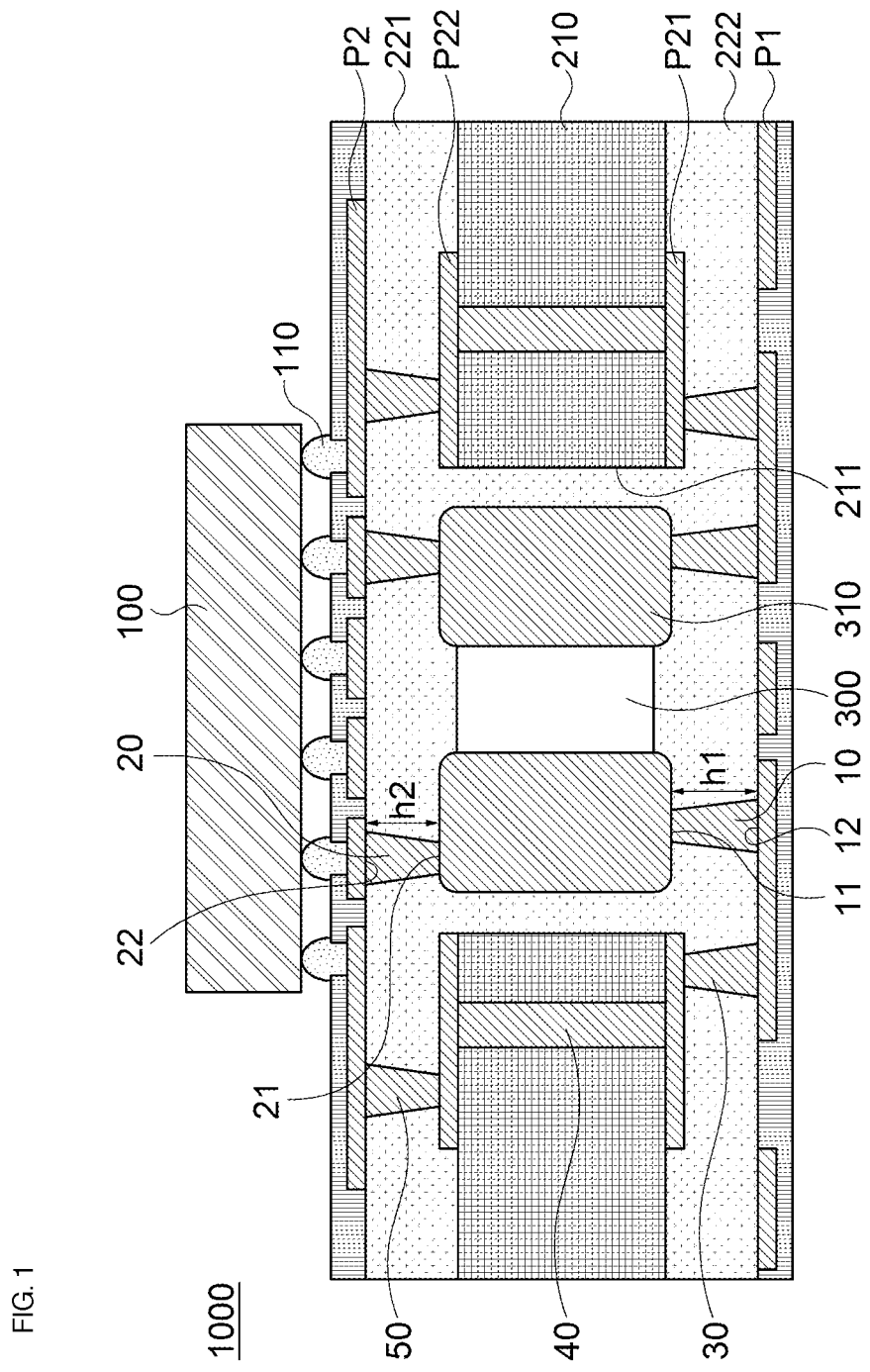
FIG. 1 is a cross-sectional view schematically illustrating a substrate embedding a passive element according to an exemplary embodiment of the present invention.

Various advantages and features of the present invention and methods accomplishing thereof will become apparent from the following description of exemplary embodiments with reference to the accompanying drawings. However, the present invention may be modified in many different forms and it should not be limited to exemplary embodiments set forth herein. These exemplary embodiments may be provided so that this disclosure will be thorough and complete, and will fully convey the scope of the invention to those skilled in the art. Like reference numerals throughout the description denote like elements.

Terms used in the present specification are for explaining exemplary embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

For simplification and clearness of illustration, a general configuration scheme will be shown in the accompanying drawings, and a detailed description of the feature and the technology well known in the art will be omitted in order to prevent a discussion of exemplary embodiments of the present invention from being unnecessarily obscure. Additionally, components shown in the accompanying drawings are not necessarily shown to scale. For example, sizes of some components shown in the accompanying drawings may be exaggerated as compared with other components in order to assist in understanding of exemplary embodiments of the present invention. Like reference numerals on different drawings will denote like components, and similar reference numerals on different drawings will denote similar components, but are not necessarily limited thereto.

In the specification and the claims, terms such as "first", "second", "third", "fourth", and the like, if any, will be used to distinguish similar components from each other and be used to describe a specific sequence or a generation sequence, but is not necessarily limited thereto. It may be understood that these terms are compatible with each other under an appropriate environment so that exemplary embodiments of the present invention to be described below may be operated in a sequence different from a sequence shown or described herein. Likewise, in the present specification, in the case in which it is described that a method includes a series of steps, a sequence of these steps suggested herein is not necessarily a sequence in which these steps may be executed. That is, any described step may be omitted and/or any other step that is not described herein may be added to the method.

In the specification and the claims, terms such as "left", "right", "front", "rear", "top, "bottom", "over", "under", and the like, if any, do not necessarily indicate relative positions that are not changed, but are used for description. It may be understood that these terms are compatible with each other under an appropriate environment so that exemplary embodiments of the present invention to be described below may be operated in a direction different from a direction shown or described herein. A term "connected" used herein is defined as being directly or indirectly connected in an electrical or non-electrical scheme. Targets described as being "adjacent to" each other may physically contact each other, be close to each other, or be in the same general range or region, in the context in which the above phrase is used. Here, a phrase "in an exemplary embodiment" means the same exemplary embodiment, but is not necessarily limited thereto.

Hereinafter, a configuration and an action effect of the present invention will be described in more detail with reference to the accompanying drawings.

FIG. 1 is a cross-sectional view schematically illustrating a substrate 1000 embedding a passive element according to an exemplary embodiment of the present invention.

Referring to FIG. 1, the substrate 1000 embedding a passive element according to the exemplary embodiment of the present invention may include a substrate, a passive element 300 embedded in the substrate, a first conductor pattern layer P1, a second conductor pattern layer P2, a first via 10, and a second via 20.

First, the first conductor pattern layer P1 is disposed on a lower surface of the substrate 1000 embedding a passive element and the second conductor pattern layer P2 is disposed on an upper surface of the substrate 1000 embedding a passive element.

In this case, the substrate may further include multi-layer conductor patterns, such as a third conductor pattern layer P21 and a fourth conductor pattern layer P22 in addition to the first conductor pattern layer P1 and the second conductor pattern layer P2.

Further, the substrate may further include a first insulating layer 210, a second insulating layer 221 disposed on the first insulating layer 210, a third insulating layer 222, and the like.

Here, the first insulating layer 210 may be a core substrate and one region thereof is provided with a cavity 211 which may receive the passive element 300.

Further, the second insulating layer 221 and the third insulating layer 222 may be a build-up insulating layer.

Meanwhile, one surface or both surfaces of the first insulating layer 210 may be further provided with the third conductor pattern layer P21 and the fourth conductor pattern layer P22 and a fourth via 40 penetrating through the first insulating layer 210 is disposed between the third conductor pattern layer P21 and the fourth conductor pattern layer P22 so that the third and fourth conductors P21 and P22 may be electrically conducted with each other.

The passive element 300 may be a capacitor, such as MLCC and both sides of a body part may be provided with an external electrode 310.

In this case, the passive element 300 is embedded in the substrate and at least a part of the passive element 300 may be inserted into the cavity 211 of the first insulating layer 210 as described above.

Further, the external electrode 310 of the passive element 300 may be provided with a conductive surface in the first conductor pattern layer P1 direction and the second conductor pattern layer P2 direction.

Therefore, the first via 10 is disposed between the first conductor pattern layer P1 and the external electrode 310, such that the first conductor pattern layer P1 and the external electrode 310 may be electrically connected to each other and the second via 20 is disposed between the second conductor pattern layer P2 and the external electrode 310, such that the second conductor pattern layer P2 and the external electrode 310 may be electrically connected to each other.

Further, the first conductor pattern layer P1 may be connected to the third conductor pattern layer P21 through the third via 30 and the fourth conductor pattern layer P22 may be connected to the first conductor pattern layer P1 through a fifth via 50.

Herein, it is already described that the third conductor pattern layer P21 and the fourth conductor pattern layer P22 may be electrically connected to each other through the fourth via 40.

Further, an external terminal 110 of an active element 100 may be directly connected to the second conductor pattern layer P2.

Therefore, the passive element 300 may be electrically connected to the active element 100 through a first path via the second via 20 and the second conductor pattern layer P2 and through a second path via the first via 10, the first conductor pattern layer P1, the third via 30, the third conductor pattern layer P21, the fourth via 40, the fourth conductor pattern layer P22, the fifth via 50, and the first conductor pattern layer P1.

Herein, it may be understood that the second path is relatively longer than the first path.

Meanwhile, a large number of external terminals 110 are inclined to be disposed in a narrow area as a demand for a multi-functional active element 100 is increased. When the multi-functional active element 100 is electrically connected to the second conductor pattern layer P2, a wiring width and a pitch of the second conductor pattern layer P2 need to be fine.

Therefore, in order to freely design the second conductor pattern layer P2, a size or the number of second vias 20 cannot but be limited.

FIG. 1 illustrates the case in which the conductor pattern layer is four layers, but the principle may be similarly applied to even the case in which the conductor pattern layer of six layers or more is disposed.

That is, in the passive element 300, the vias and the conductor patterns which are present in the region of the active element 100 direction are designed to have integration approximating the integration of the conductor pattern to which the active element 100 is directly contacted, such that the size or the number of second vias 20 cannot but be limited for the reason similar to the foregoing reason even when the conductor pattern layer is four layers or more.

On the other hand, in the case of an opposite side to a surface on which the active element 100 is mounted, a ball grid array is disposed outside the substrate and is connected to a mother board, and the like, such that the pitch may be relatively less limited as compared with the surface on which the active element 100 is mounted.

Therefore, the inventors of the present application intend to implement the impedance reduction effect by improving the characteristics of the second via 20 contacting the external electrode 310 of the passive element 300 at the opposite side of the region in which the active element 100 is mounted.

That is, a volume of the first via 10 is larger than that of the second via 20 to reduce the impedance of the second path as described above.

In this case, in order to increase the volume of the first via 10, a height h1 of the first via 10 may also be increased and thus the increase in the current path may occur, which is not suitable for the reduction in impedance.

Further, when a difference between the height h1 of the first via 10 and a height h2 of the second via 20 is increased, the substrate 1000 embedding a passive element is asymmetrical based on the first insulating layer 210, in which the asymmetry may cause the increase in warpage.

Therefore, the height h1 of the first via 10 may be in a range of 50 to 150% of the height h2 of the second via 20.

Meanwhile, in order to increase the volume of the first via 10, a cross sectional area of an upper surface 11 of the first via, that is, a surface on which the first via 10 contacts a lower surface of the external electrode 310 may be larger than that of a lower surface 21 of the second via, that is, a surface on which the second via 20 contacts an upper surface of the external electrode 310.

Similarly, in order to increase the volume of the first via 10, a cross sectional area of a lower surface 12 of the first via, that is, a surface on which the first via 10 contacts a lower surface of the first conductor pattern layer P1 may be larger than that of an upper surface 22 of the second via, that is, a surface on which the second via 20 contacts the second conductor pattern layer P2.

Figure 2:
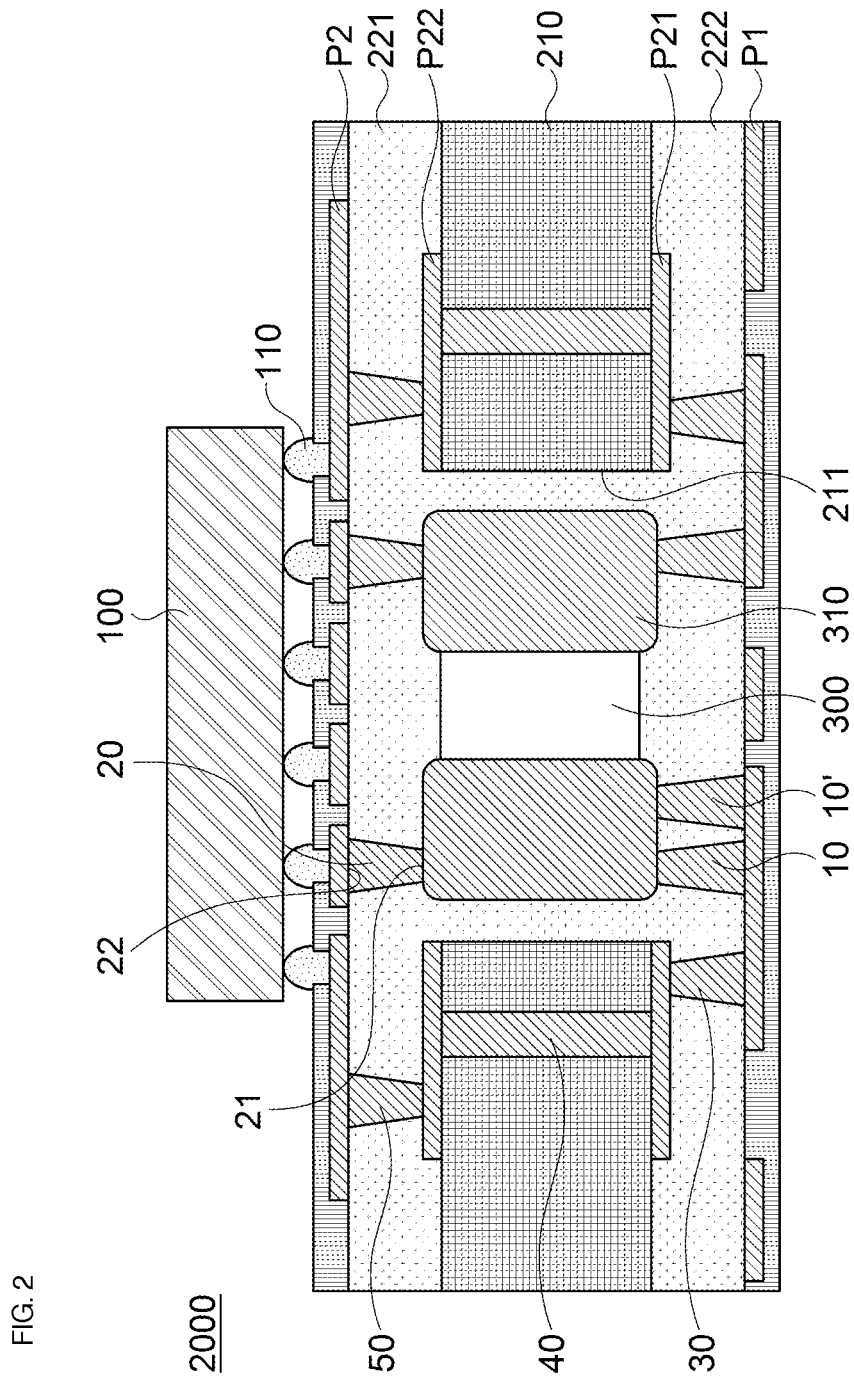
FIG. 2 is a cross-sectional view schematically illustrating a substrate embedding a passive element according to another exemplary embodiment of the present invention.

FIG. 2 is a cross-sectional view schematically illustrating a substrate 2000 embedding a passive element according to another exemplary embodiment of the present invention.

As illustrated in FIG. 2, first vias 10 and 10' are disposed in plural, thereby increasing the overall volume of first vias 10 and 10'.

Figure 3:
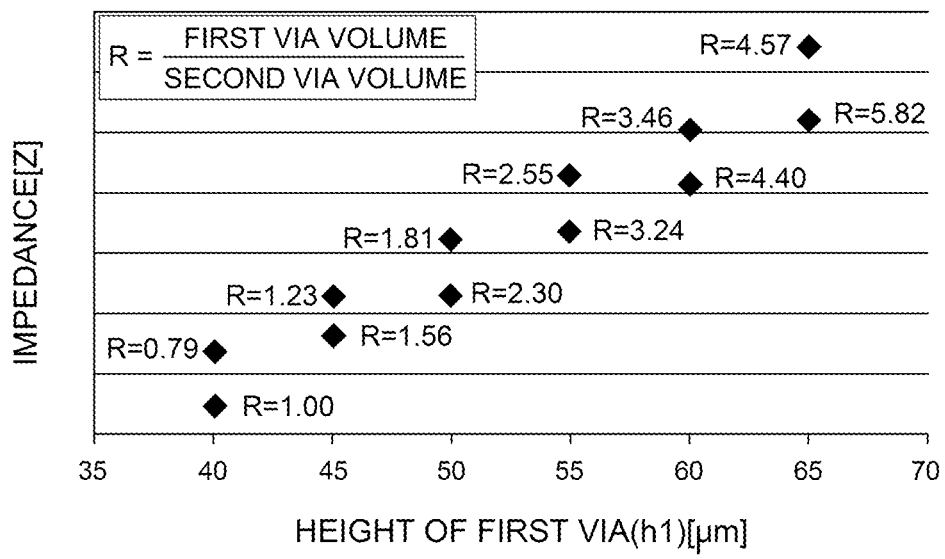
FIG. 3 is a graph schematically illustrating impedance characteristics depending on a volume ratio of a first via and a second via and a height of the first via, in the substrate embedding a passive element according to the exemplary embodiment of the present invention.

FIG. 3 is a graph schematically illustrating the impedance characteristics depending on the volume ratio of the first via 10 and the second via 20 and the height of the first via 10, in the substrate 1000 embedding a passive element according to the exemplary embodiment of the present invention.

Referring to FIG. 3, it may be understood that as the volume of the first via 10 to the volume of the second via 20 is increased, the impedance is reduced. Further, as the height of the first via 10 is reduced, the impedance is reduced.

In this case, depending on an Ohm's law, resistance, that is, the impedance is proportional to a square of the height and is inverse proportional to the volume. That is, increasing the height of the first via 10 may more increase the impedance than reducing the volume of the first via 10 at the same ratio.

However, in order to increase the height of the first via 10, there is a need to control the thickness of the embedded electronic part or the thickness of the insulating layer, such that the efficiency of the manufacturing process may be reduced and it may be difficult to design a product, thereby increasing the manufacturing cost.

In addition, as described above, considering the reduction in the warpage, the reduction in impedance is essential. However, to reduce the impedance, there is a need to largely change the thickness of the electronic part such as the passive element 300 and the thickness of the insulating layer, which is practically very difficult to implement.

Therefore, it is one aspect of the present invention to implement the impedance reduction effect by controlling the volume, size, and number of first vias 10 while keeping the height h1 of the first via 10 in a predetermined range.

Figure 4:
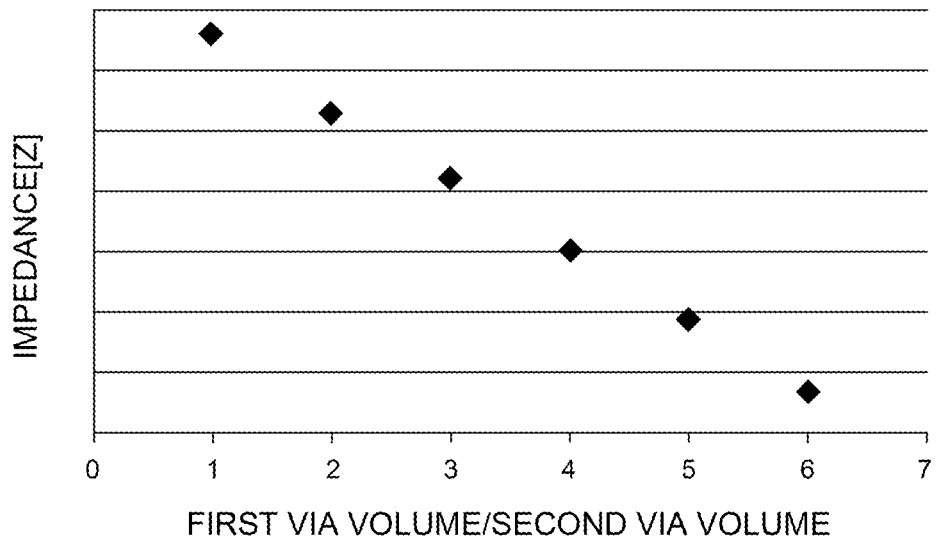
FIG. 4 is a graph schematically illustrating the impedance characteristics depending on the volume ratio of the first via and the second via in the state in which the height of the first via is fixed, in the substrate embedding a passive element according to the exemplary embodiment of the present invention.

FIG. 4 is a graph schematically illustrating the impedance characteristics depending on the volume ratio of the first via 10 and the second via 20 in the state in which the height of the first via 10 is fixed, in the substrate 1000 embedding a passive element according to the exemplary embodiment of the present invention.

Referring to FIG. 4, it may be understood that as the volume of the first via 10 is increased in the state in which the height of the first via 10 is fixed, the impedance may be reduced.

As set forth above, according to the exemplary embodiments of the present invention, it is possible to stably supply a current to the semiconductor chip even in the situation in which the power supply current is suddenly changed and improve the current moving speed, by reducing the impedance of the connection path between the passive element and other devices.

Further, as the cross sectional area between the upper and lower surfaces of the first via is increased, the connectivity and the connection reliability between the first via and the passive element may be improved.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A substrate embedding a passive element, comprising:
    a first insulating layer in which a passive element having an external electrode is embedded;
    a second insulating layer formed on an upper surface of the first insulating layer;
    a third insulating layer formed on a lower surface of the first insulating layer;
    a first conductor pattern layer disposed on a lower surface of the third insulating layer; a second conductor pattern layer disposed on an upper surface of the second insulating layer;
    a third conductive pattern layer formed on the lower surface of the first insulating layer;
    a fourth conductive pattern layer formed on the upper surface of the first insulating layer;
    a first via electrically connecting between a lower surface of the external electrode and the first conductor pattern layer;
    a second via electrically connecting between an upper surface of the external electrode and the second conductor pattern layer;
    a third via penetrating the third insulating layer and electrically connecting between the third conductive pattern layer and the first conductive pattern layer;
    a fourth via penetrating the first insulating layer and electrically connecting between the third conductive pattern layer and the fourth conductive pattern layer; and
    a fifth via penetrating the second insulating layer and electrical connecting between the fourth conductive pattern layer and the second conductive pattern layer,
    wherein the first via and the third via are both in contact with a conductive pattern of the first conductive pattern layer,
    wherein the third via and the fourth via are both in contact with a conductive pattern of the third conductive pattern layer, and
    wherein the fourth via and the fifth via are both in contact with a conductive pattern of the fourth conductive pattern layer.

2. The substrate embedding a passive element according to claim 1, wherein a height of the first via is about 0.5 to 1.5 times as large as that of the second via.

3. The substrate embedding a passive element according to claim 2, wherein a cross sectional area of a surface on which the first via contacts the lower surface of the external electrode is larger than that of a surface on which the second via contacts the upper surface of the external electrode.

4. The substrate embedding a passive element according to claim 2, wherein a cross sectional area of a surface on which the first via contacts the second conductor pattern layer is larger than that of a surface on which the second via contacts the first conductor pattern layer.

5. The substrate embedding a passive element according to claim 2, wherein among the first and second vias, the first via is disposed in plural, and the number of first vias is larger than the number of second vias.

6. The substrate embedding a passive element according to claim 1, wherein the passive element is a multi-layered ceramic capacitor.

7. The substrate embedding a passive element according to claim 1, wherein the passive element is longitudinally disposed between the first via and the second via along an axis orthogonal to the top surface of the first insulating layer.

8. The substrate embedding a passive element according to claim 1, wherein a top surface of the passive element directly contacts a bottom surface of the second via and a bottom surface of the passive element directly contacts a top surface of the first via, and an axis extending from a top surface of the first via to a lower surface of the first via is disposed to a side of an axis extending from a top surface of the second via to a lower surface of the second via.

* * * * *